United States Patent
Manipatruni et al.

(10) Patent No.: US 10,483,026 B2
(45) Date of Patent: Nov. 19, 2019

(54) METALLIC SPIN SUPER LATTICE FOR LOGIC AND MEMORY DEVICES

(71) Applicant: Intel Corporation, Santa Clara, CA (US)

(72) Inventors: Sasikanth Manipatruni, Hillsboro, OR (US); Anurag Chaudhry, Portland, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/569,978

(22) PCT Filed: Jun. 24, 2015

(86) PCT No.: PCT/US2015/037445
§ 371 (c)(1),
(2) Date: Oct. 27, 2017

(87) PCT Pub. No.: WO2016/209226
PCT Pub. Date: Dec. 29, 2016

(65) Prior Publication Data
US 2018/0158588 A1 Jun. 7, 2018

(51) Int. Cl.
*G11C 11/00* (2006.01)
*H01F 10/32* (2006.01)
(Continued)

(52) U.S. Cl.
CPC ........ *H01F 10/3268* (2013.01); *G11C 11/155* (2013.01); *G11C 11/1675* (2013.01);
(Continued)

(58) Field of Classification Search
CPC . H01F 10/3268; H01F 10/265; G11C 11/155; G11C 11/1675; H01L 43/08; H01L 43/10; H03K 19/16
(Continued)

(56) References Cited

U.S. PATENT DOCUMENTS

| | | | | |
|---|---|---|---|---|
| 6,123,780 A | * | 9/2000 | Kanai | B82Y 10/00 |
| | | | | 148/108 |
| 8,455,966 B2 | * | 6/2013 | Garner | H01L 29/66984 |
| | | | | 257/421 |

(Continued)

FOREIGN PATENT DOCUMENTS

| | | |
|---|---|---|
| EP | 1306850 | 5/2003 |
| WO | 2014204492 | 12/2014 |

OTHER PUBLICATIONS

International Preliminary Report on Patentability for International Patent Application No. PCT/US15/37445, dated Jan. 4, 2018.
(Continued)

*Primary Examiner* — Viet Q Nguyen
(74) *Attorney, Agent, or Firm* — Green, Howard & Mughal LLP

(57) ABSTRACT

Described is an apparatus which comprises: an input ferromagnet to receive a first charge current and to produce a corresponding spin current; and a stack of metal layers configured to convert the corresponding spin current to a second charge current, wherein the stack of metal layers is coupled to the input magnet.

19 Claims, 9 Drawing Sheets

(51) Int. Cl.
*H01L 43/10* (2006.01)
*H01L 43/08* (2006.01)
*H03K 19/16* (2006.01)
*G11C 11/16* (2006.01)
*G11C 11/155* (2006.01)
*H03K 19/18* (2006.01)
*H01F 10/26* (2006.01)

(52) U.S. Cl.
CPC .............. *H01L 43/08* (2013.01); *H01L 43/10* (2013.01); *H03K 19/16* (2013.01); *H03K 19/18* (2013.01); *H01F 10/265* (2013.01)

(58) Field of Classification Search
USPC .......................................................... 365/158
See application file for complete search history.

(56) References Cited

U.S. PATENT DOCUMENTS

| | | | |
|---|---|---|---|
| 8,933,521 B2* | 1/2015 | Nikonov | H01L 27/22 257/421 |
| 9,128,142 B1* | 9/2015 | Qu | G01R 33/1284 |
| 9,281,467 B2* | 3/2016 | Manipatruni | H01L 43/08 |
| 9,300,295 B1* | 3/2016 | Zhang | G11C 11/18 |
| 9,391,262 B1* | 7/2016 | Nikonov | H01L 43/04 |
| 9,460,188 B2* | 10/2016 | Mundlapudi | G06F 17/30563 |
| 9,460,768 B2* | 10/2016 | Manipatruni | G11C 11/1675 |
| 9,559,698 B2* | 1/2017 | Nikonov | G11C 11/161 |
| 9,620,188 B2* | 4/2017 | Manipatruni | G11C 11/18 |
| 9,712,171 B2* | 7/2017 | Nikonov | B82Y 25/00 |
| 10,062,731 B2* | 8/2018 | Manipatruni | H01L 27/22 |
| 2006/0050446 A1 | 3/2006 | Ishizone et al. | |
| 2012/0176154 A1 | 7/2012 | Behin-Aein et al. | |
| 2013/0154633 A1 | 6/2013 | Fujiwara et al. | |
| 2014/0091411 A1 | 4/2014 | Manipatruni et al. | |
| 2014/0169088 A1* | 6/2014 | Buhrman | G11C 11/18 365/158 |
| 2014/0252439 A1* | 9/2014 | Guo | G11C 11/18 257/295 |
| 2014/0269035 A1 | 9/2014 | Manipatruni et al. | |
| 2014/0312441 A1* | 10/2014 | Guo | H01L 43/04 257/427 |
| 2015/0145576 A1* | 5/2015 | Wu | H01L 43/08 327/187 |
| 2015/0269478 A1* | 9/2015 | Datta | G06N 3/063 706/33 |
| 2016/0099407 A1* | 4/2016 | Lim | H01L 43/08 257/425 |
| 2016/0169988 A1* | 6/2016 | Sirringhaus | G01R 33/1284 324/251 |
| 2016/0225982 A1* | 8/2016 | Guo | H01L 43/08 |
| 2017/0243917 A1* | 8/2017 | Manipatruni | H01L 27/22 |
| 2017/0338021 A1* | 11/2017 | Xiao | H01F 10/30 |
| 2018/0033954 A1* | 2/2018 | Aradhya | H01L 43/06 |
| 2018/0114898 A1* | 4/2018 | Lee | G11C 11/161 |
| 2018/0182954 A1* | 6/2018 | Sayed | H01L 43/04 |
| 2018/0240583 A1* | 8/2018 | Manipatruni | G11C 11/161 |
| 2018/0240964 A1* | 8/2018 | Nikonov | H01L 43/08 |
| 2018/0366173 A1* | 12/2018 | Zhu | G11C 11/161 |
| 2019/0036018 A1* | 1/2019 | Manipatruni | G11B 5/738 |

OTHER PUBLICATIONS

International Search Report and Written Opinion for PCT/US15/37445 dated Mar. 22, 2016, 10 pages.

Isasa, et al., "Detection of inverse Rashba-Edelstein effect at Cu/Bi interface using lateral spin valves", arXiv preprint arXiv:1409.8540 (2014) (Abstract only).

Liu, L. Q. et al., "Spin-Torque Ferromagnetic Resonance Induced by the Spin Hall Effect", Phys. Rev. Lett. 106, 036601 (2011).

Liu, L. Q., "Spin-Torque Switching with the Giant Spin Hall Effect of Tantalum", Science 336, 555 (2012); DOI: 10.1126/science.1218197.

Rojas Sanchez, J.C. et al., "Spin-to-charge conversion using Rashba coupling as the interface between non-magnetic materials", Nature Communications, 4:2944 (2013).

Shen, et al., "Microscopic Theory of the Inverse Edelstein Effect", Physical Review letters 112, 096601 (2014).

EP Extended European Search Report dated Feb. 15, 2019 for EP Patent Application No. 15896517.8.

* cited by examiner

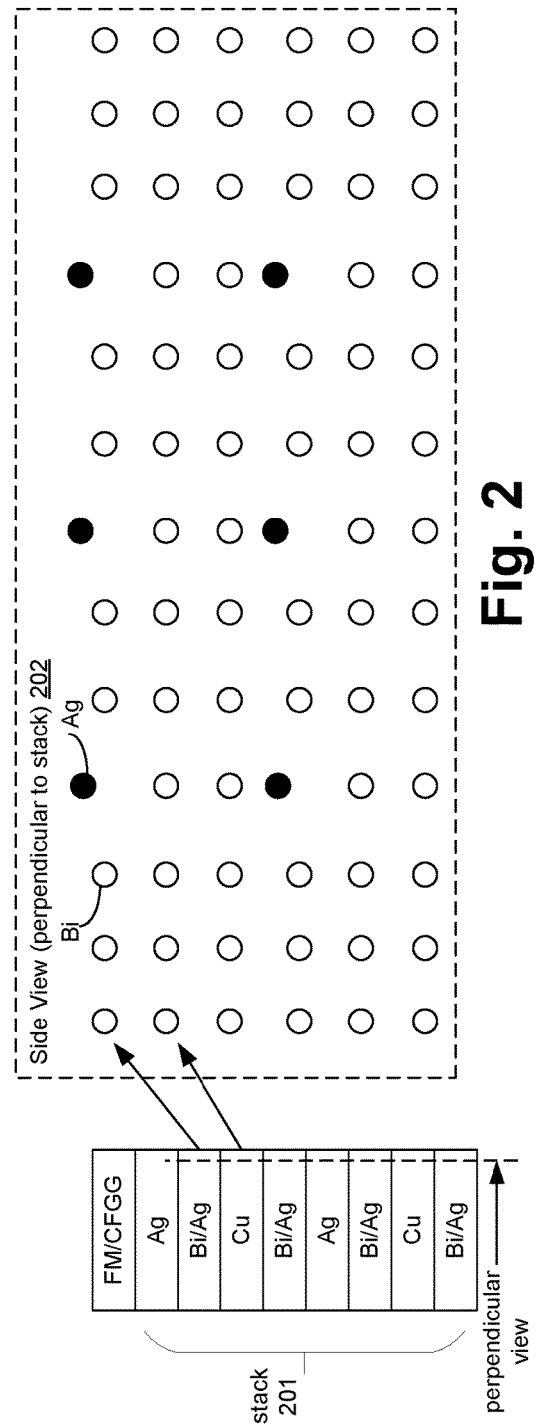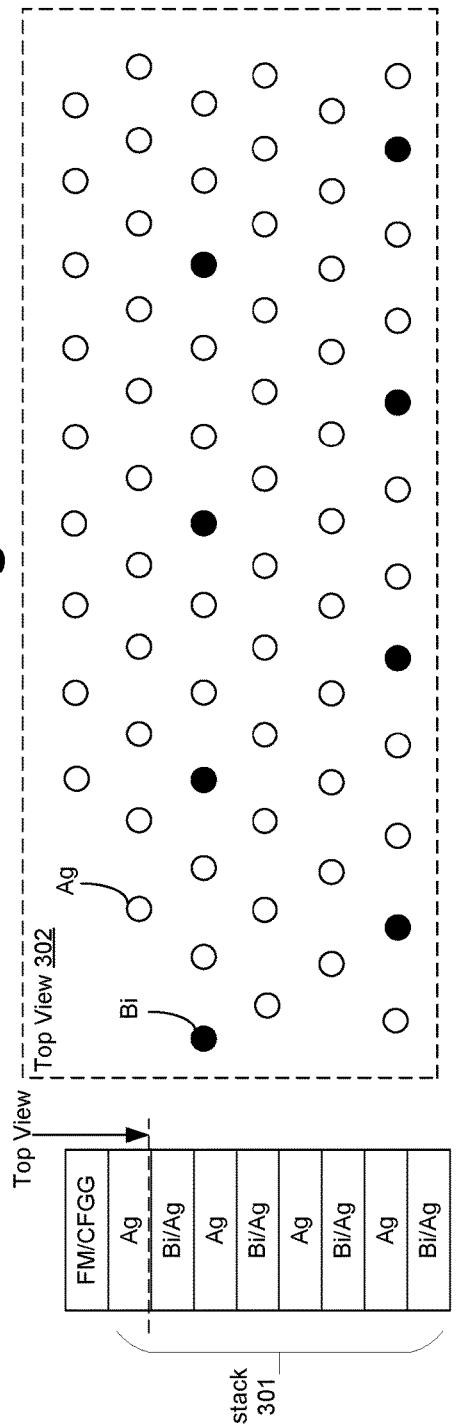

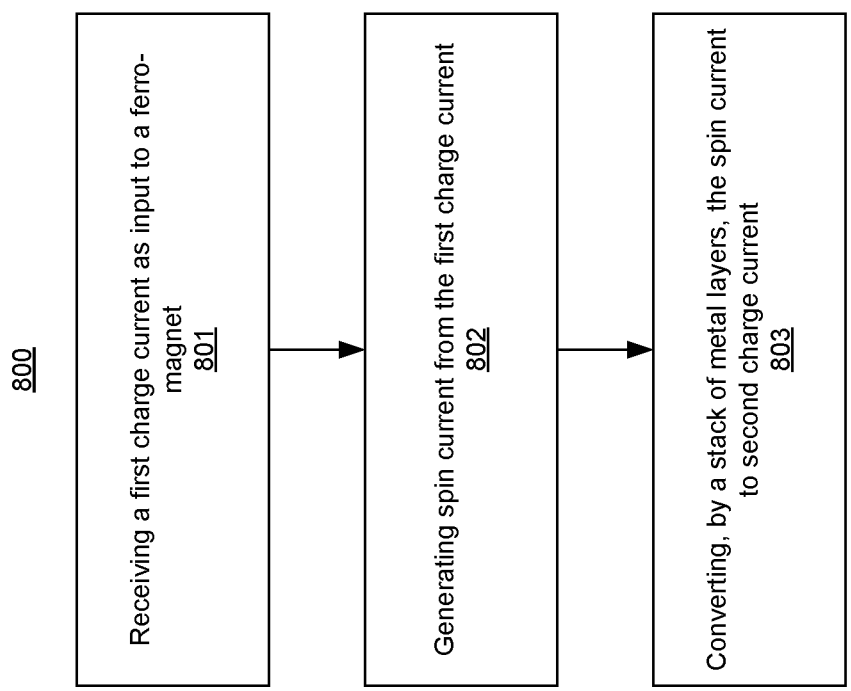

METALLIC SPIN SUPER LATTICE FOR LOGIC AND MEMORY DEVICES

CLAIM OF PRIORITY

This Application is a National Stage Entry of, and claims priority to, PCT Application No. PCT/US15/37445, filed on 24 Jun. 2015 and titled "METALLIC SPIN SUPER LATTICE FOR LOGIC AND MEMORY DEVICES", which is incorporated by reference in its entirety for all purposes.

BACKGROUND

Detecting a state of a magnet is a basic computation step for magnetic memory and magnetic logic devices. The state of the magnet determines whether it is storing a logic zero or logic one. An example of a magnetic memory is Spin Transfer Torque (STT) Magnetic Random Access Memory (MRAM). In STT MRAM, the state of the magnetic memory is determined by sensing a resistance of a magnetic device of the memory, and then comparing that resistance against a reference resistance. Conversion of the magnetic state to a charge variable is also important for magnetic spin logic and interconnects. For example, a charge variable such as current can flow through long interconnects to other magnetic spin logic. Existing magnet detection is based on magnetic tunnel junctions (MTJs) and/or spin current interconnects which suffer from several limitations, however.

For example, conversion from spin current to charge variable mediated by Tunneling Magneto Resistance (TMR) has limited conversion efficiency, TMR based readout from a memory limits the device resistance to a range of 4 k to 8 K Ohms, and spin current based interconnects are limited in interconnect length due to spin degradation along the length of the interconnect. These limitations and constraints result in limited read speeds of the STT MRAM as a well as limited interconnect options for spin logic.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 illustrates a spin-to-charge conversion super-lattice stack and corresponding side view of its atomic structure, according to some embodiments.

FIG. 3 illustrates a spin-to-charge conversion super-lattice stack using $BiAg_2$ and corresponding top view of its atomic structure, according to some embodiments of the disclosure.

FIG. 8 illustrates a flowchart of a method for converting spin-to-charge using a super-lattice stack, according to some embodiments of the disclosure.

DETAILED DESCRIPTION

Figure 1A:
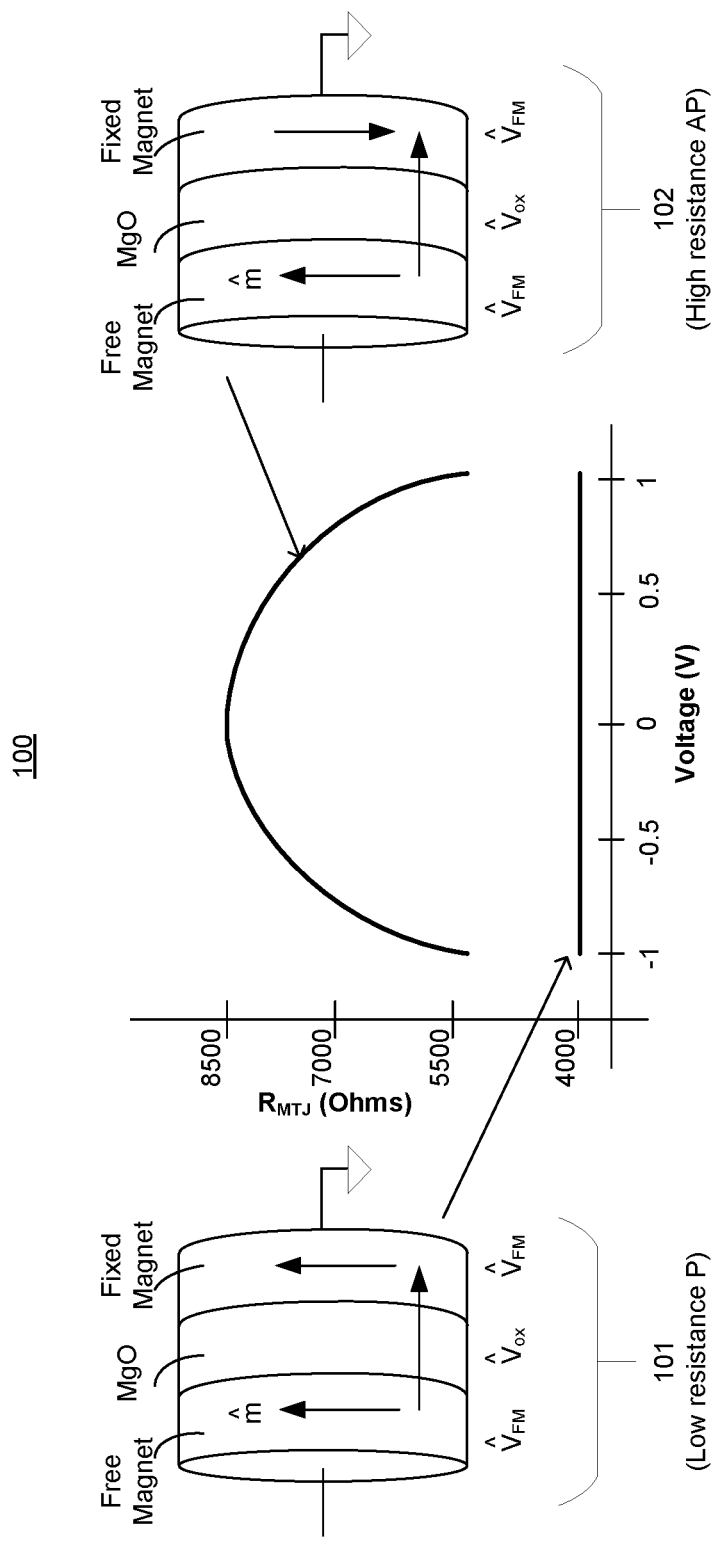
FIG. 1A illustrates a Magnetic Tunneling Junction (MTJ) with typical Tunnel Magneto Resistance (TMR) based readout of the MTJ.

Tunnel Magneto Resistance (TMR) based spin-to-charge variable conversion has limited conversion efficiency. FIG. 1A illustrates a typical TMR based readout of a Magnetic Tunneling Junction (MTJ) 100. In one example, MTJ 101/102 comprises stacking a ferromagnetic layer (e.g., Free Magnet) with a tunneling dielectric (e.g., MgO) and another ferromagnetic layer (Fixed Magnet). The plot in the center illustrates the dependence of resistance ($R_{MTJ}$) on voltage across MTJ 101/102 for the two magnetization directions of the Free Magnet relative to the Fixed Magnet, where resistance is in Ohms and voltage in Volts. Here, MTJ 101 illustrates the low resistance state where the magnetization of the Free Magnet is in the same direction as the magnetization of the Fixed Magnet (i.e., the directions of magnetizations are parallel (P) to each other). MTJ 102 illustrates the high resistance state where the direction of magnetization of the Free Magnet is in the opposite direction as the direction of magnetization of the Fixed Magnet (i.e., the directions of magnetizations are anti-parallel (AP) to each other).

Here, the read out of the magnetization is obtained via sensing of a resistance change across MTJ 101/102 on the order of 4 k Ohms (which translates to a voltage of 40 mV to 80 mV at 10 µA read current). In this example, 10 µA of read current limits the total read time to 5 ns to 10 ns, which is slow. As such, the TMR based read out of MTJs 101/102 is highly limited in the signal strength and speed it can generate.

Figure 1B:
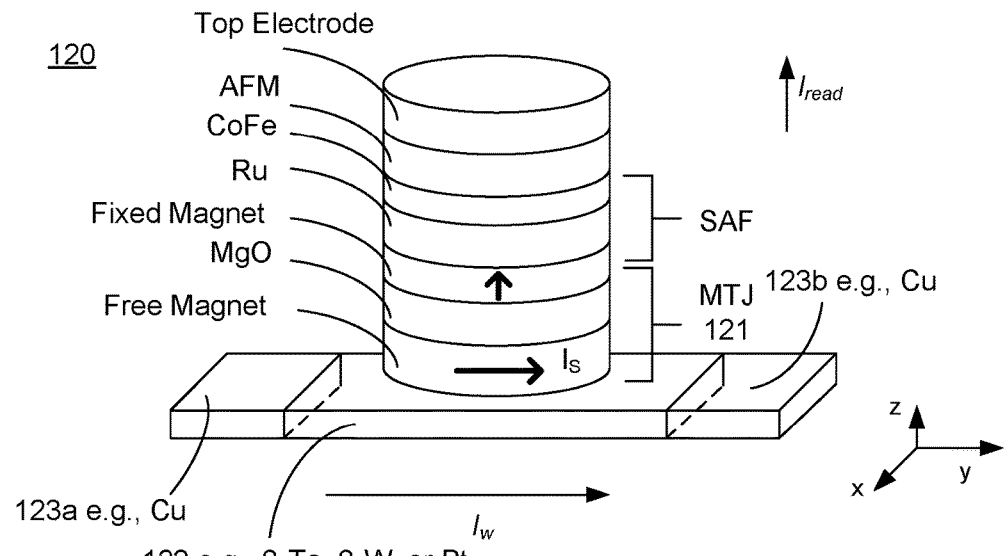
FIG. 1B illustrates a stack of layers having a MTJ coupled to an electrode formed of Spin Hall Effect (SHE) material, where the SHE material converts charge current to spin current.

FIG. 1B illustrates stack of layers 120 having a MTJ coupled to an electrode formed of Spin Hall Effect (SHE) material, where the SHE material converts charge current $I_W$ (or write current) to spin current $I_S$. Stack 120 forms a three terminal memory cell with SHE induced write mechanism and MTJ based read-out. Stack 120 comprises MTJ 121, SHE Interconnect or electrode 122, and non-magnetic metal (s) 123a/b. In one example, MTJ 121 comprises stacked ferromagnetic layer with a tunneling dielectric and another ferromagnetic layer. One or both ends along the horizontal direction of SHE Interconnect 122 is formed of non-magnetic metals 123a/b.

A wide combination of materials can be used for material stacking of MTJ 121. For example, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are fractions of elements in the alloys. Other materials may also be used to form MTJ 121. MTJ 121 stack comprises free magnetic layer, MgO tunneling oxide, a fixed magnetic layer which is a combination of CoFe/Ru/CoFe layers referred to as Synthetic Anti-Ferromagnet (SAF)—based, and an Anti-Ferromagnet (AFM) layer. The SAF layer has the property, that the magnetizations in the two CoFe layers are opposite, and allows for cancelling the dipole fields around the free magnetic layer such that a stray dipole field will not control the free magnetic layer.

SHE Interconnect 122 (or the write electrode) is made of one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. SHE Interconnect 122 transitions into high conductivity non-magnetic metal(s) 123a/b to reduce the resistance of SHE Interconnect 122. The non-magnetic metal(s) 123a/b are formed from one or more of: Cu, Co, α-Ta, Al, CuSi, or NiSi.

In one case, the magnetization direction of the fixed magnetic layer is perpendicular relative to the magnetization direction of the free magnetic layer (i.e., magnetization directions of the free and fixed magnetic layers are not parallel, rather they are orthogonal). For example, magnetization direction of the free magnetic layer is in-plane while the magnetization direction of the fixed magnetic layer is perpendicular to the in-plane. In another case, magnetization direction of the fixed magnetic layer is in-plane while the magnetization direction of the free magnetic layer is perpendicular to the in-plane.

The thickness of a ferromagnetic layer (i.e., fixed or free magnetic layer) may determine its magnetization direction. For example, when the thickness of the ferromagnetic layer is above a certain threshold (depending on the material of the magnet, e.g. approximately 1.5 nm for CoFe), then the ferromagnetic layer exhibits magnetization direction which is in-plane. Likewise, when the thickness of the ferromagnetic layer is below a certain threshold (depending on the material of the magnet), then the ferromagnetic layer exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

In this example, the applied current $I_w$ is converted into spin current $I_s$ by SHE Interconnect 122. This spin current switches the direction of magnetization of the free layer and thus changes the resistance of MTJ 121. However, to read out the state of MTJ 121, a sensing mechanism is needed to sense the resistance change. In the case of FIG. 1A, this resistance change can be significantly higher than 4 k Ohms and therefore is easier to sense. The conversion of charge current to spin current is described with reference to FIG. 1C.

Figure 1C:
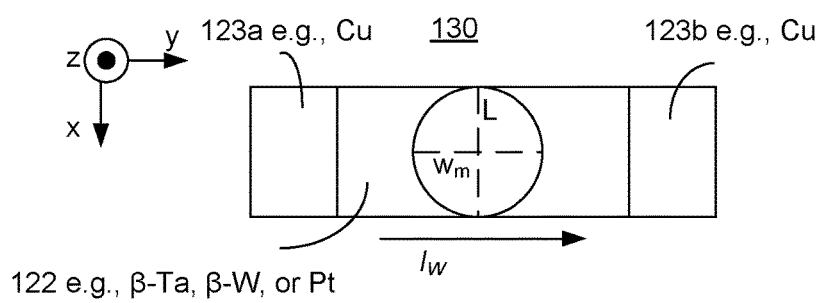
FIG. 1C illustrates a top view of the stack of FIG. 1C.

FIG. 1C illustrates top view 130 of the stack of FIG. 1C. It is pointed out that those elements of FIG. 1C having the same reference numbers (or names) as the elements of any other figure can operate or function in any manner similar to that described, but are not limited to such. Top view 130 shows that the magnet is oriented along the width of SHE Interconnect 122 for appropriate spin injection.

The magnetic cell is written by applying a charge current via SHE Interconnect 122. The direction of the magnetic writing (in the free magnet layer) is decided by the direction of the applied charge current. Positive currents (i.e., currents flowing in the +y direction) produce a spin injection current with transport direction (along the +z direction) and spins pointing to the +x direction. The injected spin current in-turn produces spin torque to align the free magnet (coupled to the SHE material) in the +x or −x direction. The injected spin current $\vec{I}_s$ generated by a charge current $\vec{I}_c$ in the write electrode is given by:

$$\vec{I}_s = P_{SHE}(w,t,\lambda_{sf},\theta_{SHE})(\hat{z} \times \vec{I}_c) \quad (1)$$

where, the vector of spin current $\vec{I}_s = \vec{I}_\uparrow - \vec{I}_\downarrow$ is the difference of currents with spin along and opposite to the spin direction, $\hat{z}$ the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect 122, $\lambda_{sf}$ is the spin flip length in SHE Interconnect 122, $\theta_{SHE}$ is the spin Hall angle for SHE Interconnect 122 to free ferromagnetic layer interface. The injected spin angular momentum responsible for the spin torque given by:

$$\vec{S} = \hbar \vec{I}_s / 2e \quad (2)$$

The spin to charge conversion described with reference to FIGS. 1A-C is based on TMR which is highly limited in the signal strength generated. As such, the TMR based spin to charge conversion has low efficiency (i.e., less than one).

Some embodiments describe a highly efficient transduction method and associated apparatus for converting spin currents to charge currents. In some embodiments, spin-to-charge conversion is achieved via spin orbit interaction in metallic interfaces (i.e., using Inverse Rashba-Edelstein Effect and/or SHE) where a spin current injected from an input magnet produces a charge current. Table 1 summarizes transduction mechanisms for converting spin current to charge current and charge current to spin current for bulk materials and interfaces.

TABLE 1

Transduction mechanisms for Spin to
Charge and Charge to Spin Conversion

|  | Charge → Spin | Spin → Charge |
| --- | --- | --- |
| Bulk | Spin Hall Effect | Inverse Spin Hall Effect |
| Interface | Rashba-Edelstein Effect | Inverse Rashba-Edelstein |

In some embodiments, the sign of the charge current is determined by the direction of magnetization. In some embodiments, a metallic super lattice is described which enhances the spin-to-charge conversion (i.e., improves the conversion efficiency). In some embodiments, a metallic stack is described which structurally matches to the superlattice at the atomistic scale for high quality spin injection.

There are many technical effects of various embodiments. For example, in some embodiments, spin-to-charge variable efficiency conversion of one is achieved. In some cases, a net gain in spin-to-charge conversion is also observed. By converting spin to charge efficiently, long distance interconnects can be used to convey the charge which can later be converted to spin again for logic operations by spin logic. Other technical effects will be evident by various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 2 illustrates a spin-to-charge conversion super-lattice stack 201 and corresponding side view of its atomic structure 202, according to some embodiments. Super-lattice stack 201 is functionally equivalent to spin Hall interconnect 122 in FIG. 1B, its side view 201. In some embodiments, super-lattice stack 201 comprises layers of metals, such as Copper (Cu), Silver (Ag), Gold (Au), and layers of a surface alloy, e.g. Bismuth (Bi) on Ag. In some embodiments, a ferromagnetic (FM) layer is deposited on top of the super-lattice 201, where the FM layer is made from CFGG (i.e., Cobalt (Co), Iron (Fe), Germanium (Ge), or Gallium (Ga) or a combination of them). In some embodiments, 'N' number of layers of surface alloy and metal are stacked in alternating fashion, where 'N' is an integer. In one example, N=10 which is sufficient to convert input spin current to corresponding charge current with efficiency of one or higher. In other examples, other number of layers may be used to trade off conversion efficiency versus area of the stack.

In some embodiments, the FM layer on top of the super-lattice 201 is formed of $Co_2FeGeGa$, $Co_2FeAl$, or other Heusler alloys, etc. In some embodiments, the surface alloy is one of: Bi—Ag, Antimony-Bismuth (Sb—Bi), Sb—Ag, or Lead-Nickel (Pb—Ni), etc. In some embodiments, the metal is a noble metal (e.g., Ag, Cu, Au) doped with other elements for group 4d and/or 5d of the Periodic Table. In some embodiments, one of the metals of the surface alloy is an alloy of heavy metal or of materials with high Spin Orbit Coupling (SOC) strength, where the SOC strength is directly proportional to the fourth power of the atomic number of the metal.

In some embodiments, all metal layers are of the same type of metal. For example, all metal layers of stack 201 are formed of Ag. In other embodiments, different metal layers may be used in the same stack for the metal portion of the layers. For example, some metal layers of stack 201 are formed of Ag and others are formed of Cu.

In some embodiments, the atomic structure in side view 202 shows non-uniform patterns of Ag and Bi atoms of the surface alloy sandwiched between layers of Cu or other metals. Here, the crystals of Ag and Bi have lattice mismatch, i.e. the distance between neighboring atoms of Ag and Bi is different. In some embodiments, the surface alloy is formed with surface corrugation resulting from the lattice mismatch, i.e. the positions of Bi atoms are offset by varying distance from a plane parallel to a crystal plane of the underlying metal. The surface alloy is a structure not symmetric relative to the mirror inversion defined by a crystal plane. This inversion asymmetry leads to spin-orbit coupling in electrons near the surface (also referred to as the Rashba effect).

FIG. 3 illustrates a spin-to-charge conversion super-lattice stack 301 (i.e., side view 301) using Ag/Bi/Ag and corresponding top view 302 of its atomic structure, according to some embodiments of the disclosure. It is pointed out that those elements of FIG. 3 having the same reference numbers (or names) as the elements of any other figure can operate or function in any manner similar to that described, but are not limited to such. The atomic structure of FIG. 3 is similar to FIG. 2 except that Cu of stack 201 is replaced with Ag, and that the view is a top view of stack 301. The surface alloys of different materials, such as in stack 201 produce a larger spin-orbit coupling than stack 301, but may be more difficult to manufacture.

In some embodiments, the input nanomagnets FM on stack 201/301 inject a spin polarized current into the high SOC material stack. In some embodiments, the input nanomagnets FM are a Heusler alloy lattice matched to Ag, i.e., the Heusler alloy is engineered to have a lattice constant close (e.g., within 3%) to that of Ag. In some embodiments, the direction of spin polarization is determined by the magnetization direction of the input magnet.

In some embodiments, the interface surface alloy of BiAg$_2$/PbAg$_2$ comprises of a high density two dimensional (2D) electron gas with high Rashba SOC. The spin orbit mechanism responsible for spin-to-charge conversion is described by Rashba effect in 2D electron gases. In some embodiments, 2D electron gases are formed between Bi and Ag, and when current flows through the 2D electron gases, it becomes a 2D spin gas because as charge flows, electrons get polarized.

The Hamiltonian energy HR of the SOC electrons in the 2D electron gas corresponding to the Rashba effect is expressed as:

$$H_R = \alpha_R (k \times \hat{z}) \cdot \vec{\sigma} \quad (3)$$

where $\alpha_R$ is the Rashba coefficient, 'k' is the operator of momentum of electrons, $\hat{z}$ is a unit vector perpendicular to the 2D electron gas, and $\vec{\sigma}$ is the operator of spin of electrons.

The spin polarized electrons with direction of polarization in-plane (in the xy-plane) experience an effective magnetic field dependent on the spin direction which is given as:

$$B(\hat{k}) = \frac{\alpha_R}{\mu_B}(\hat{k} \times \hat{z}) \quad (4)$$

where $\mu_B$ is the Bohr magneton.

This results in the generation of a charge current in the interconnect proportional to the spin current $I_s$. The spin orbit interaction at the Ag/Bi interface (i.e., the Inverse Rashba-Edelstein Effect (IREE)) produces a charge current in the horizontal direction which is expressed as:

$$I_c = \frac{\lambda_{IREE} I_s}{w_m} \quad (5)$$

where $W_m$ is width of the magnet, and $\lambda_{IREE}$ is the IREE constant (with units of length) proportional to $\alpha_R$.

The IREE effect produces spin-to-charge current conversion around 0.1 with existing materials at 10 nm magnet width. For scaled nanomagnets (e.g., 5 nm width) and exploratory SHE materials such as Bi$_2$Se$_3$, the spin-to-charge conversion efficiency can be between 1 and 2.5, in accordance with some embodiments. The net conversion of the drive charge current $I_d$ to magnetization dependent charge current is:

$$I_c = \pm \frac{\lambda_{IREE} P I_d}{w_m} \quad (6)$$

where P is the spin polarization.

Figure 4:
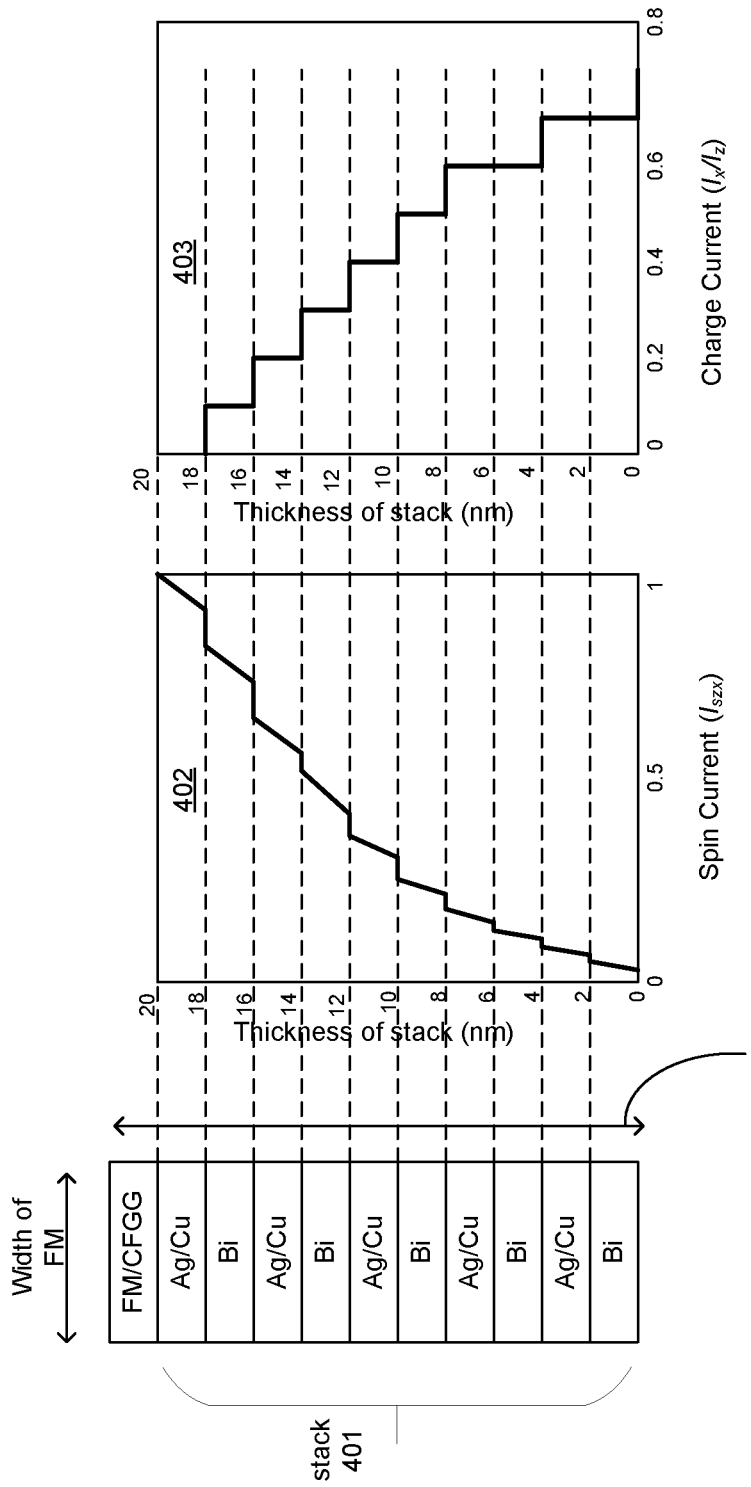
FIG. 4 illustrates a spin-to-charge conversion over layers of the super-lattice stack, according to some embodiments of the disclosure.

FIG. 4 illustrates plots 402 and 403 showing spin-to-charge conversion over layers of super-lattice stack 401, according to some embodiments of the disclosure. It is pointed out that those elements of FIG. 4 having the same reference numbers (or names) as the elements of any other figure can operate or function in any manner similar to that described, but are not limited to such.

Plots 402 and 403 illustrate conversion efficiency as a function of the thickness of the super-lattice stack 401. Here, for plot 402, the x-axis is the injected spin current $I_s$ (in the z-direction) while the y-axis is the thickness of super-lattice stack 401 (in nanometer (nm)), while for plot 403, the x-axis is charge current $I_c$ (in the x-direction) while the y-axis is the thickness of super-lattice stack 401. The horizontal dashed-lines indicate the interfaces of the layers of super-lattice stack 401 for plots 402 and 403.

Plot 402 indicates an exponential decay of the injected spin current $I_s$ in super-lattice stack 401 due to the spin de-coherence in Ag. The decay occurs down the thickness of super-lattice stack 401, according to some embodiments. The spin current $I_s$ drops in steps at the interface of surface alloy and the metal of stack 401, and is a gradient between the surface, according to some embodiments. Plot 403 indicates the conversion of the injected spin current $I_s$ to charge current $I_c$ at every interface of metal and surface alloy. For example, spin-to-charge conversion occurs at every interface of Bi and Ag leading to the production of an in-plane charge current, according to some embodiments. In some embodiments, after ten layers of surface alloy and metal layers of super-lattice stack 401, most of the injected spin current $I_s$ decays (i.e., the spin current is converted to charge current).

Figure 5B:
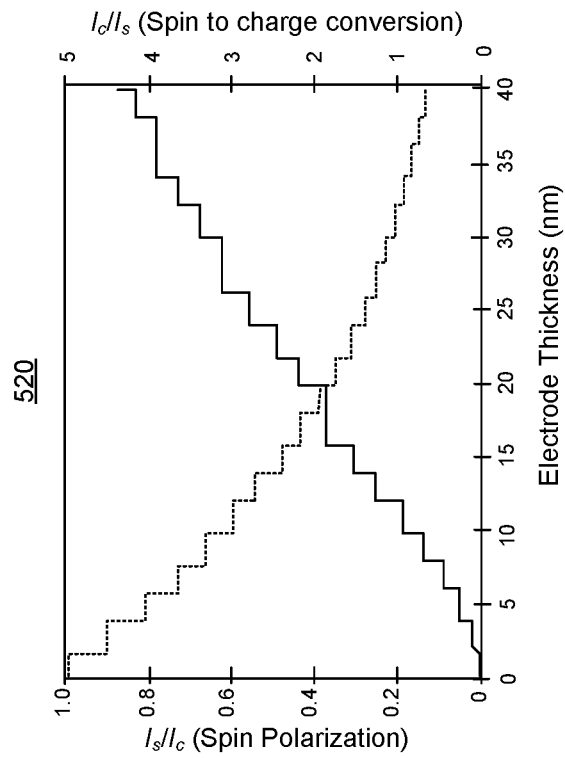
FIGS. 5A-B illustrate plots showing spin-to-charge conversion efficiency for different Silver (Ag) diffusion lengths, according to some embodiments of the disclosure.
Figure 5A:
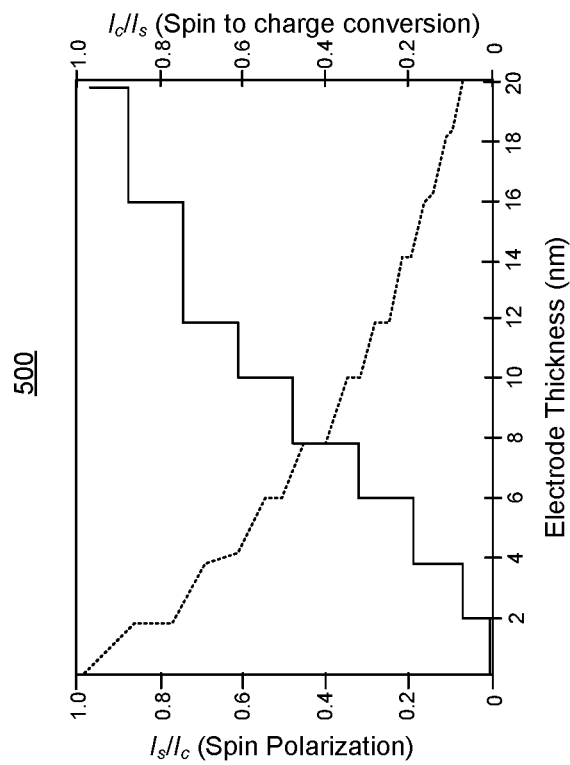

FIGS. 5A-B illustrate plots 500 and 520 showing spin-to-charge conversion efficiency for different Ag diffusion lengths, according to some embodiments of the disclosure. It is pointed out that those elements of FIGS. 5A-B having the same reference numbers (or names) as the elements of any other figure can operate or function in any manner similar to that described, but are not limited to such. For both plots 500 and 520, the x-axis is the Electrode Thickness in nm (i.e., thickness of super-lattice stack 401), the y-axis to the left is Spin Polarization (i.e., ratio of Spin Current $I_c$ to Charge Current $I_s$), and the y-axis to the right is the ratio of spin to charge conversion (i.e., $I_c/I_s$).

Plot 500 illustrates two waveforms—solid and dashed. In this example, the spin diffusion length of Ag is 15 nm (i.e., $\lambda_{Ag}$=15 nm), $\lambda_{IREE}$, and width of magnet $W_m$=20 nm. The solid waveform shows how charge current increases as spin current passes through the layers of super-lattice stack 401. The rise in the steps of the charge current are at the interface of Bi/Ag. At the end of super-lattice stack 401 (in this example, near the stack thickness of 20 nm), 85% of spin current $I_s$ converts into charge current $I_c$ (i.e., the efficiency is 0.85). The dashed waveform shows the spin polarization as a function of electrode thickness. As spin current flows down through the layers of super-lattice stack 401, it loses polarization because it converts to charge current. At the end of super-lattice stack 401 (in this example, at a stack thickness of 20 nm), most spin current is gone (i.e., converted to charge current).

Plot 520 is similar to plot 500, but the spin diffusion length of Ag is increased to 200 nm from 15 nm. Plot 520 shows a gain in the charge current (i.e., greater than one spin-to-charge current conversion efficiency). Here, a net conversion efficiency of four can be achieved with a spin diffusion length of 200 nm.

Figure 6A:
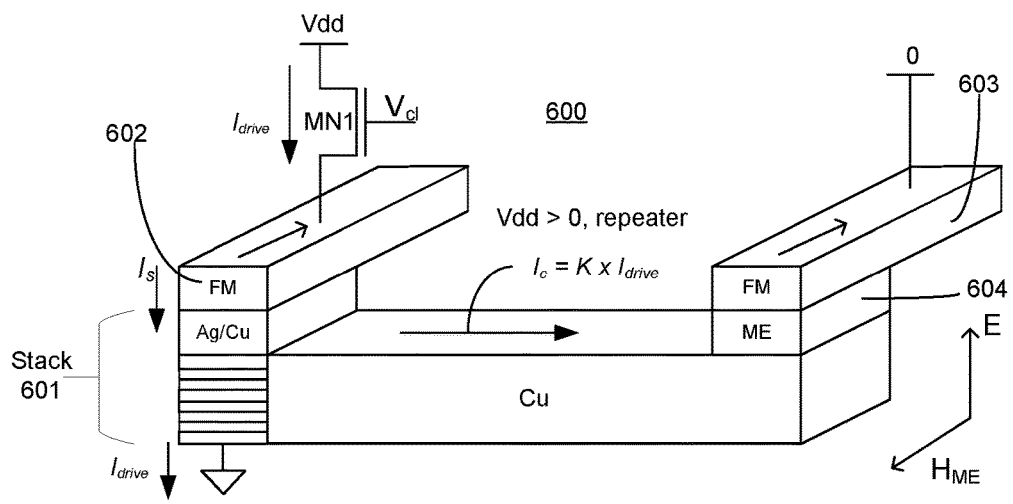
FIGS. 6A-B illustrate a magneto-electric logic device with super-lattice stack for spin-to-charge conversion, according to some embodiments of the disclosure.
Figure 6B:
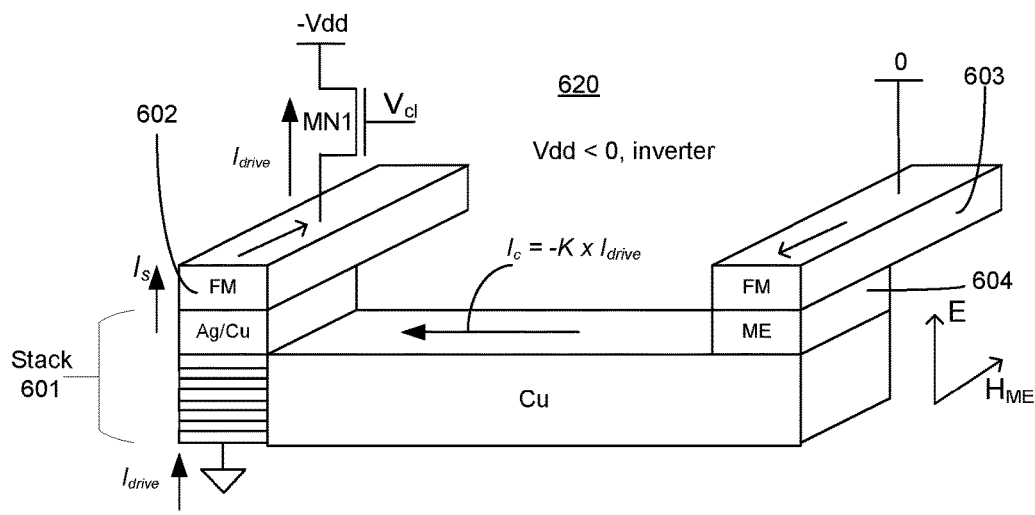

FIGS. 6A-B illustrate magneto-electric logic devices 600 and 620 with super-lattice stack 601 (201/301/401) for spin-to-charge conversion, according to some embodiments of the disclosure. It is pointed out that those elements of FIGS. 6A-B having the same reference numbers (or names) as the elements of any other figure can operate or function in any manner similar to that described, but are not limited to such.

In some embodiments, magneto-electric logic devices 600 and 620 comprise a first terminal (i.e., input terminal) having super-lattice stack 601 coupled to a first magnet 602 (which can be considered to be part of super-lattice stack 601), non-magnetic metal interconnect (e.g., Cu interconnect), a second magnet 603, and an interface of a magnetoelectric (ME) material 604. Some examples of single phase magnetoelectric material 604 are $Cr_2O_3$ and multiferroic materials (e.g., $TbMnO_3$, $HoMn_2O_5$, $LuFe_2O_4$ and PZTFT). Other examples are the Bi compounds, such as $BiFeO_3$ and $BiMnO_3$, non-perovskite oxide $LiCu_2O_2$, and non-oxides such as $BaNiF_4$ and spinel chalcogenides, e.g. $ZnCr_2Se_4$) which show a coupling between the magnetic and electric order parameters. Composite magnetoelectric materials are combinations of magnetostrictive and electrostrictive materials, such as ferromagnetic and piezoelectric materials. In some embodiments, ME material 604 is an insulator, and therefore the charge current in the Cu interconnect charges the metal interfaces of ME. Due to that charging, a voltage forms across ME material 604. In the presence of this voltage, the magnetoelectric effect switches magnetization in second magnet 603.

The first magnet 602 is also referred to as the input magnet and the second magnet 603 is also referred to as the output magnet. In some embodiments, a transistor MN1 is coupled to first magnet 602 to provide it with a drive current $I_{drive}$ (or charge current) when the clocking voltage $V_{cl}$ (e.g., periodic input voltage) is raised above the transistor threshold voltage. Here, the source terminal of transistor MN1 is coupled to first magnet 602 while the drain terminal of MN1 is coupled to a power supply node Vdd. In some embodiments, transistor MN1 can be replaced with a p-type transistor MP1 and associated logic can be adjusted accordingly.

In some embodiments, when transistor MN1 is turned on, $I_{drive}$ is injected into first magnet 602, where it becomes spin polarized current $I_s$. In some embodiments, super-lattice stack 601 converts the spin polarized current $I_s$ to corresponding charge current $I_c$, the sign of which is determined by the magnetization direction of first magnet 602.

In some embodiments, when the spin current $I_s$ flows through the 2D electron gas between Bi and Ag in super-lattice 601 with high SOC, charge current $I_c$ is generated. For example, after propagating through 10 layers of super-lattice stack 601, spin current $I_s$ is completely converted to charge current $I_c$, according to some embodiments. The charge current $I_c$ then propagates through the non-magnetic interconnect Cu coupled to super-lattice stack 601, and as such the charge current flows from first terminal 602 (coupled to Vdd) to second terminal 603 (coupled to ground).

In some embodiments such as that shown in FIG. 6A, magneto-electric logic device 600 is operable to function as a repeater (i.e., buffer). The injected charge current charges magneto-electric stack 604 producing a large effective magnetic field on output magnet 603 to align its magnetization to be parallel to the magnetization of 602.

In some embodiments, magneto-electric logic device 620 of FIG. 6B is operable to function as an inverter. In this example, the first terminal above magnet 602 is coupled to a negative power supply (i.e., −Vdd<0) while the second terminal below magnet 602 is coupled to ground (i.e. 0V). In this case, the direction of charge current $I_c$ is reversed relative to the charge current $I_c$ in case of FIG. 6A. Referring back to FIG. 6B, the injected charge current charges magneto-electric stack 604 producing a large effective magnetic field on the output magnet (i.e., second magnet 603) to align its magnetization to be opposite to the magnetization of 602.

Figure 7A:
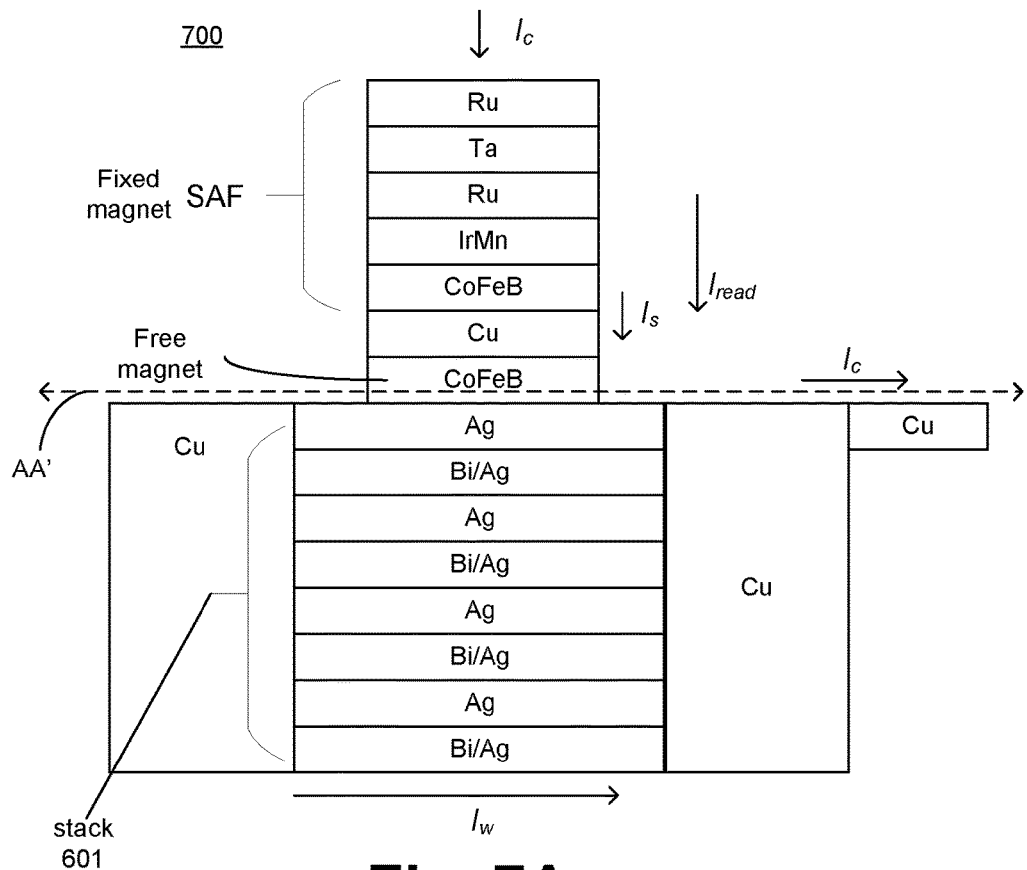
FIG. 7A illustrates a magnetic memory device comprising a super-lattice for spin-to-charge conversion, according to some embodiments of the disclosure.

FIG. 7A illustrates magnetic memory device 700 comprising a super-lattice for spin-to-charge conversion, according to some embodiments of the disclosure. It is pointed out that those elements of FIG. 7A having the same reference numbers (or names) as the elements of any other figure can operate or function in any manner similar to that described, but are not limited to such.

One of the outstanding issues with MRAM scaling relates to the difficulty in conductivity scaling (i.e., scaling of the product of resistance and area) and TMR of the MTJs, which limits both the write and read performance of the MRAM. This limitation is mitigated using magnetic memory device 700, according to some embodiments.

In some embodiments, magnetic memory device 700 comprises stack 601 (or one of 201/301/401) coupled to a non-magnetic interconnect (e.g., Cu) and a magnetic stack including a Free magnet (e.g., CoFeB) and a Fixed magnet (e.g., CoFeB). In some embodiments, the layer between the Free and Fixed magnets is a non-magnetic metal (e.g., Cu). As such, the stack having the Free and Fixed magnets is a fully metal stack providing lower resistance compared to stacks having non-metallic layer(s) such as MgO. In some embodiments, the layer between the Free and Fixed magnets is an insulator (e.g., MgO). In some embodiments, the Fixed magnet is formed by a stack of CoFeB, IrMn, Ru, and Ta as shown. In some embodiments, the Fixed magnet is formed with a stack of layers (e.g., SAF) as described with reference to FIG. 1B.

Referring back to FIG. 7A, in some embodiments, write operation is performed using forward Rashba effect from the stack having the Fixed and Free magnets. For example, write current $I_w$ is passed horizontally through stack 601 which converts charge current $I_c$ to spin current $I_s$ vertically and this spin current $I_s$ sets the magnetization direction of the Free magnet. As such, data is written into magnetic memory device 700.

In some embodiments, read operation is performed similarly to that in a conventional magnetic RAM. For example, a read current is conducted vertically through the MTJ between the free and the fixed magnets. The difference of resistances for parallel and anti-parallel magnetizations is sensed with a sense amplifier (not shown). In other embodiments, the magnetization is sensed using an inverse Rashba effect through metallic super-lattice 601. The read current $I_{read}$ is conducted vertically through the Free magnet. Then, the spin polarized current $I_s$ is emitted out of the Free magnet as charge current $I_c$, where there direction of charge current $I_c$ is determined by the direction of magnetization of the Free magnet on super-lattice stack 601.

There are many technical effects of using super-lattice stack 601 for implementing magnetic memory device 700. For example, magnetic memory device 700 can be operated at lower voltages compared to MTJ based magnetic memory device, magnetic memory device 700 offers higher reliability when MgO dielectric between the Free and Fixed magnets is replaced with metal (e.g., Cu), and magnetic memory device 700 offers higher speeds than MTJ based magnetic memory device because limitations of TMR in converting spin current to charge current are mitigated by the super lattice stack of surface alloys and metals.

Figure 7B:
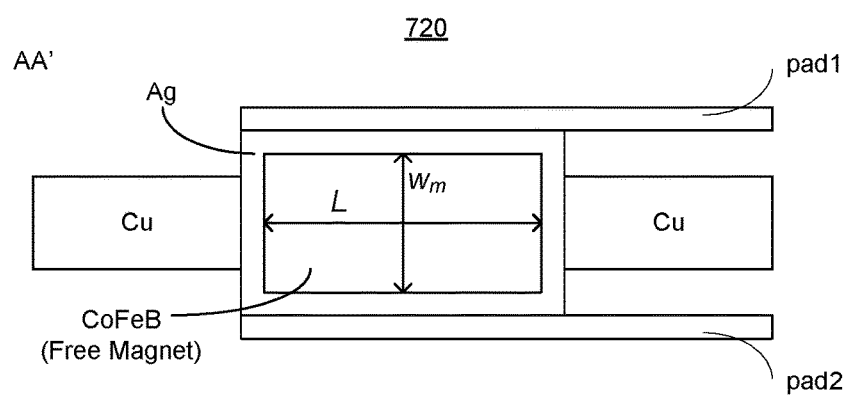
FIG. 7B illustrates a top view of the magnetic memory device of FIG. 7A, according to some embodiments of the disclosure.

FIG. 7B illustrates a top view 720 of the magnetic memory device of FIG. 7A, according to some embodiments of the disclosure. It is pointed out that those elements of FIG. 7B having the same reference numbers (or names) as the elements of any other figure can operate or function in any manner similar to that described, but are not limited to such. In some embodiments, when $I_{read}$ is injected, voltage is developed across the width 'w' of the magnet.

FIG. 8 illustrates flowchart 800 of a method for converting spin-to-charge using a super-lattice, according to some embodiments of the disclosure. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 801, a first charge current is provided as input to a ferromagnet. For example, $I_{drive}$ charge current is received by input nanomagnets as described with reference to FIG. 6B. Referring back to FIG. 8, at block 802, spin current is generated from the charge current. At block 802, the spin current is converted to charge current (i.e., second charge current) as the spin current propagates through the layers of metallic super-lattice 601. In some embodiments, the direction of the charge current depends on the magnetization direction of the magnet coupled to the Bi/Ag stack. This charge current can then be transmitted over longer distances (compared to spin current) using non-magnetic interconnects (e.g., Cu).

Figure 9:
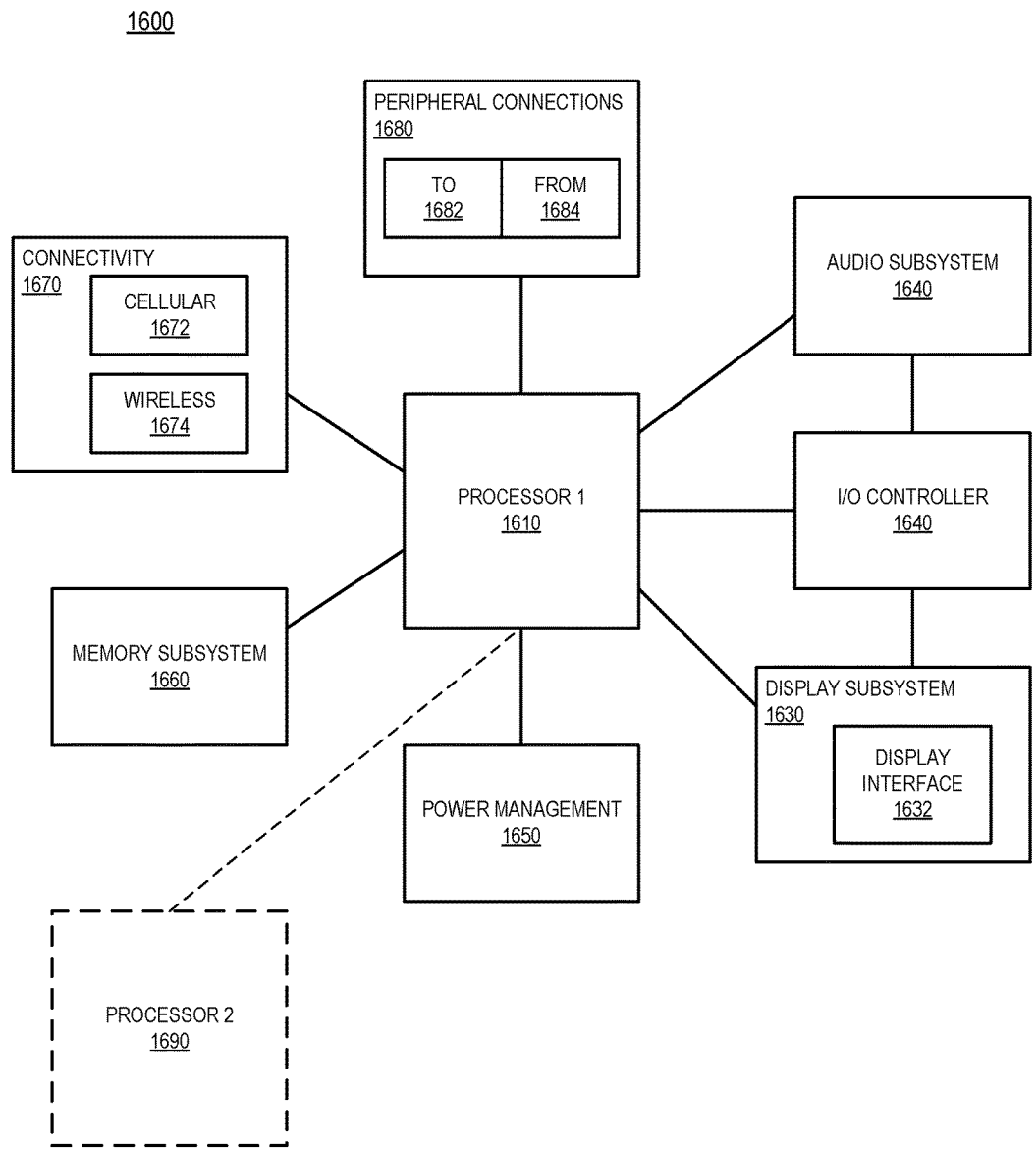
FIG. 9 illustrates a smart device or a computer system or a SoC (System-on-Chip) with spin-to-charge conversion super-lattice stack, according to some embodiments.

FIG. 9 illustrates a smart device or a computer system or a SoC (System-on-Chip) with spin-to-charge conversion super-lattice stack, according to some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with spin-to-charge conversion super-lattice stack, according to some embodiments discussed. Other blocks of the computing device 1600 may also include spin-to-charge conversion super-lattice stack, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: an input ferromagnet to receive a first charge current and to produce a corresponding spin current; and a stack of metal layers configured to convert the corresponding spin current to a second charge current, wherein the stack of metal layers is coupled to the input ferromagnet. In some embodiments, the stack of metal layers forms a spin metallic supper-lattice with a surface alloy. In some embodiments, the surface alloy has a surface corrugation. In some embodiments, one of the metals of the surface alloy is a heavy metal.

In some embodiments, the spin metallic super-lattice is a lattice of the surface alloy and a non-alloy metal. In some embodiments, the non-alloy metal of the stack is coupled to the input ferromagnet. In some embodiments, the non-alloy metal is at least one of: Ag, Cu, or Au. In some embodiments, the surface alloy is at least one of: Bi and Ag; Bi and Cu; or Pb and Ag. In some embodiments, the corresponding spin current is converted to the second charge current as the corresponding spin current flows through the surface alloy and the non-alloy metal.

In some embodiments, the surface alloy has a high density two dimensional (2D) electron gas with high Rashba spin orbit coupling. In some embodiments, the 2D electron gas becomes a 2D spin gas when the second charge current flows though the 2D electron gas. In some embodiments, the spin metallic super-lattice is matched to the input ferromagnet. In some embodiments, the non-alloy metal of the spin metallic super-lattice is matched to the input ferromagnet, and wherein the non-alloy metal is followed by an interface of the surface alloy. In some embodiments, the input ferromagnet is a Heusler alloy. In some embodiments, the sign or direction of the second charge current is according to a direction of magnetization of the input ferromagnet.

In another example, a system is provided which comprises: a memory; a processor coupled to the memory, the processor having an apparatus according to the apparatus described above; and a wireless interface for allowing the processor to communicate with another device.

In another example, a magnetic memory device is provided which comprises: a fixed magnetic layer; a free magnetic layer coupled to the fixed magnetic layer via an intermediate layer; and a stack of metal layers formed of a spin metallic supper-lattice with a surface alloy and a non-alloy metal, wherein the non-alloy metal is coupled to the free magnetic layer. In some embodiments, the fixed magnetic layer to receive an input charge current, wherein the free magnetic layer to generate a corresponding spin current, and wherein the stack of metal layers is configured to convert the corresponding spin current to an output charge current.

In some embodiments, the magnetic memory device comprises a metal interconnect coupled to the stack to provide the output charge current to another device. In some embodiments, the stack is operable for write operation by a forward Rashba effect. In some embodiments, the stack is operable for read operation by an inverse Rashba-Edelstein effect. In some embodiments, the intermediate layer is either a metal layer or an insulator layer.

In another example, a system is provided which comprises: a processor; a memory coupled to the processor, the memory having magnetic memory device according the magnetic memory device described above; and a wireless interface for allowing the processor to communicate with another device.

In another example, a method is provided which comprises: receiving, by an input ferromagnet, a first charge current and to produce a corresponding spin current; and converting, by a stack of metal layers, the corresponding spin current to a second charge current, wherein the stack of metal layers is coupled to the input ferromagnet. In some embodiments, the method further comprises forming the stack of metal layers by forming a spin metallic supper-lattice with a surface alloy. In some embodiments, the surface alloy has a surface corrugation. In some embodiments, one of the metals of the surface alloy is a heavy metal.

In some embodiments, the spin metallic super-lattice is a lattice of the surface alloy and a non-alloy metal. In some embodiments, the method comprises coupling the non-alloy metal of the stack to the input ferromagnet. In some embodiments, the non-alloy metal is at least one of: Ag, Cu, or Au.

In some embodiments, the surface alloy is at least one of: Bi and Ag; Bi and Cu; or Pb and Ag. In some embodiments, converting the corresponding spin current to the second charge current is performed as the corresponding spin current flows through the surface alloy and the non-alloy metal.

In some embodiments, the surface alloy has a high density two dimensional (2D) electron gas with high Rashba spin orbit coupling. In some embodiments, the method comprises: converting the 2D electron gas to a 2D spin gas when the second charge current flows though the 2D electron gas. In some embodiments, the method comprises matching the spin metallic super-lattice to the input ferromagnet. In some embodiments, the method comprises matching the non-alloy metal of the spin metallic super-lattice to the input ferromagnet, and wherein the non-alloy metal is followed by an interface of the surface alloy. In some embodiments, the input ferromagnet is a Heusler alloy. In some embodiments, the sign or direction of the second charge current is according to a direction of magnetization of the input ferromagnet.

In another example, an apparatus is provided which comprises: means for receiving a first charge current; means for producing a spin current corresponding to the first charge current; and means for converting, by a stack of metal layers, the corresponding spin current to a second charge current, wherein the stack of metal layers is coupled to the means for receiving. In some embodiments, the apparatus comprises means for forming the stack of metal layers by forming a spin metallic supper-lattice with a surface alloy.

In some embodiments, the surface alloy has a surface corrugation. In some embodiments, one of the metals of the surface alloy is a heavy metal. In some embodiments, the spin metallic super-lattice is a lattice of the surface alloy and a non-alloy metal. In some embodiments, the non-alloy metal is at least one of: Ag, Cu, or Au. In some embodiments, the surface alloy is at least one of: Bi and Ag; Bi and Cu; or Pb and Ag.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
 a magnet to receive a first charge current and to produce a corresponding spin current; and
 a stack of structures, wherein the stack is to convert the corresponding spin current to a second charge current, wherein one structure of the stack of structures is adjacent to the magnet, and wherein the stack comprises a spin metallic super-lattice which includes a lattice of an alloy and a non-alloy metal.

2. The apparatus of claim 1, wherein the alloy has a surface corrugation.

3. The apparatus of claim 1, wherein the alloy comprises a heavy metal.

4. The apparatus of claim 1, wherein the non-alloy metal of the stack is coupled to the magnet.

5. The apparatus of claim 4, wherein the non-alloy metal includes one of:
 Ag,
 Cu, or
 Au.

6. The apparatus of claim 1, wherein the alloy includes one of:
 Bi and Ag;

Bi and Cu; or

Pb and Ag.

7. The apparatus of claim 1, wherein the corresponding spin current is converted to the second charge current as the corresponding spin current flows through the alloy and the non-alloy metal.

8. The apparatus of claim 1, wherein the alloy has a high density two dimensional (2D) electron gas with high Rashba spin orbit coupling, and wherein the 2D electron gas becomes a 2D spin gas when the second charge current flows though the 2D electron gas.

9. The apparatus of claim 1, wherein the spin metallic super-lattice is matched to the magnet.

10. The apparatus of claim 1, wherein the non-alloy metal of the spin metallic super-lattice is matched to the magnet, and wherein the non-alloy metal is followed by an interface of the alloy.

11. The apparatus of claim 1, wherein the magnet comprises a Heusler alloy.

12. The apparatus of claim 1, wherein a sign or direction of the second charge current is according to a direction of magnetization of the magnet.

13. A system comprising:

a memory;

a processor coupled to the memory, the processor having an apparatus which includes:

an input ferromagnet to receive a first charge current and to produce a corresponding spin current; and a stack of metal layers configured to convert the corresponding spin current to a second charge current, wherein the stack of metal layers is coupled to the input ferromagnet, wherein the stack of metal layers forms a spin metallic super-lattice with a surface alloy, and wherein the spin metallic super-lattice includes a lattice of the surface alloy and a non-alloy metal; and a wireless interface to allow the processor to communicate with another device.

14. The apparatus of claim 1, wherein the stack is operable for write operation by a forward Rashba effect, and wherein the stack is operable for read operation by an inverse Rashba-Edelstein effect.

15. The apparatus of claim 1 comprises an interconnect including metal, wherein the interconnect is adjacent to a sidewall of the stack to provide the output charge current to another device.

16. An apparatus comprising:

a magnet; and a stack of structures adjacent to the magnet, wherein the stack comprises a spin metallic super-lattice which includes a lattice of an alloy and a non-alloy metal, wherein:

the non-alloy metal includes one of: Ag, Cu, or Au; and the alloy includes one of: Bi and Ag; Bi and Cu; or Pb and Ag.

17. The apparatus of claim 16, comprises an interconnect including metal, wherein the interconnect is adjacent to a sidewall of the stack to provide the output charge current to another device.

18. The apparatus of claim 16, wherein the alloy has a surface corrugation.

19. The apparatus of claim 16, wherein the alloy comprises a heavy metal.

* * * * *